United States Patent [19]

Malhi et al.

[11] Patent Number: 4,549,193

[45] Date of Patent: Oct. 22, 1985

[54] FIELD EFFECT TRANSISTOR DEVICE UTILIZING CRITICAL BURIED CHANNEL CONNECTING SOURCE AND DRAIN

[75] Inventors: Satwinder D. Malhi; Clement A. Salama, both of Toronto, Canada

[73] Assignee: University of Toronto Innovations Foundation, Toronto, Canada

[21] Appl. No.: 304,998

[22] Filed: Sep. 23, 1981

[30] Foreign Application Priority Data

Sep. 26, 1980 [CA] Canada .................................. 362480

[51] Int. Cl.⁴ .......................................... H01L 29/80
[52] U.S. Cl. .................................... 357/22; 357/23.1; 357/23.11; 357/43
[58] Field of Search .................. 357/43, 22, 226, 23.1, 357/23.11

[56] References Cited

U.S. PATENT DOCUMENTS

| 4,044,452 | 8/1977 | Abbas et al. ................ 357/43 X |
| 4,050,965 | 9/1977 | Ipri et al. .................... 357/43 X |
| 4,176,368 | 11/1979 | Compton ..................... 357/43 X |
| 4,216,490 | 8/1980 | Ohki ............................ 357/43 |
| 4,311,532 | 1/1982 | Taylor .......................... 357/43 X |
| 4,322,738 | 3/1982 | Bell et al. .................... 357/22 |
| 4,412,238 | 10/1983 | Khadder et al. ............. 357/22 X |

FOREIGN PATENT DOCUMENTS 0067372 6/1978 Japan .................................. 357/23.1

Primary Examiner—Andrew J. James
Assistant Examiner—William A. Mintel
Attorney, Agent, or Firm—Murray, Whisenhunt & Ferguson

[57] ABSTRACT

The invention provides a new structure for a subsurface junction field effect transistor (SJFET) and a new process for its fabrication, the process being especially compatible with existing processes for the fabrication of bipolar devices. Spaced zones of p+ type are diffused into an n-type epitaxial layer to terminate the channel and connect to source and drain terminals. Spaced zones of n+ type are diffused into the epitaxial layer to define the channel width. The corresponding zones for the bipolar device can be formed at the same time. A passivating layer of silicon dioxide is applied and the subsurface p-type channel formed by ion implantation to leave a thin n-type layer between the channel and the silicon dioxide layer. Upon application of a metal layer over the silicon dioxide layer in the neighborhood of the channel, and its connection to the back gate terminal, a stable electron accumulation layer forms at the surface of the n-type layer which interfaces with the silicon dioxide layer. This electron accumulating layer buffers the device against variations in the characteristics of the silicon dioxide layer and its interfaces with the adjacent layers. The resultant matching of devices on the same chip or wafer is equivalent to that of more complex and time-consuming prior art processes requiring a second implant step to produce a buffering n+ type layer.

3 Claims, 3 Drawing Figures

4,549,193

FIELD EFFECT TRANSISTOR DEVICE UTILIZING CRITICAL BURIED CHANNEL CONNECTING SOURCE AND DRAIN

FIELD OF THE INVENTION

The present invention is concerned with improvements in or relating to field effect transistor devices, and to methods of production thereof.

REVIEW OF THE PRIOR ART

Junction field effect transistor devices (JFETS) are attractive circuit elements for very low power integrated circuits intended, for example, to operate from a single battery cell of about 1.0–1.5 volts; such devices should therefore operate with pinchoff voltages appreciably below 1 volt, and with such lower pinchoff voltages satisfactory uniformity from transistor to transistor becomes more difficult to obtain.

Because of the prevalent use of bipolar integrated circuits in solid state technology JFETS are commonly used in conjunction with bipolar transistors (BTS) and it is desirable that they should be producible on the same substrate using techniques that are as similar as possible. For example in one known process a p diffusion for the JFET channel is performed simultaneously with the base of an npn BT, and subsequent n+ diffusions for the JFET gate is performed simultaneously with an n+ diffusion for the BT emitter. It is difficult to control such diffusions and the resulting JFET devices consequently usually do not have consistent pinchoff voltage characteristics. Accordingly a more preferred prior art production process involves two separate ion implantations of n+ and p areas in order to produce a subsurface junction directly and to permit more precise control of doping concentration and channel thickness. In such a double process, for example, the JFET channel is implanted simultaneously with the BT base zone, while the n+ gate zone for the JFET must be produced by a second implantation, resulting in a relatively complex and time-consuming process.

DEFINITION OF THE INVENTION

It is therefore an object of the present invention to provide a subsurface junction field effect transistor device of new configuration.

It is also an object to provide a new method for the production of subsurface junction field effect transistor devices that is compatible with processes for the production of npn bipolar transistor devices and requires only a single implantation step.

In accordance with the present invention there is provided a subsurface junction field effect transistor device comprising a layer of n-type epitaxial silicon material having a surface in which a p-type channel is implanted in the said n-type epitaxial layer below the surface thereof to provide a thin electron accumulating n-type layer between the channel and an adjacent portion of the surface of the epitaxial material.

The channel merging into respective p-type zones at which source and drain terminals are provided and the thin electron-accumulating layer being coupled to the n-type epitaxial layer.

A silicon dioxide layer overlies at least the thin electron-accumulating layer; and a conductive metal layer electrically connected to the device gate and overlying the silicon dioxide layer at least in the neighbourhood of the electron-accumulating layer, whereby an electron-accumulating n-type zone is established in the electron accumulating layer at its layer surface interfacing with the silicon dioxide layer. The n-type zone provides an electric field to raise the surface potential in the n-type zone above the potential of the gate to buffer said n-type channel from the passivating layer.

Also in accordance with the invention there is provided a method of producing a subsurface junction field effect transistor comprising the steps, of:

diffusing in a layer of n-type epitaxial silicon material two spaced p-type zones at which source and drain terminals are provided then applying over at least the epitaxial layer surface between the spaced p-type zones a layer of silicon dioxide implanting in the epitaxial layer below the surface thereof a p-type channel communicating with the said p-type zones, and so as to leave a thin electron-accumulating n-type layer between the channel and the adjacent portion of the epitaxial layer surface;

applying over the silicon dioxide layer at least in the neighbourhood of the thin electron-accumulating layer a conductive metal layer electrically connected to the gate terminal, whereby an electron-accumulating zone of n type is established in the thin electron-accumulating layer at the layer surface interfacing with the silicon dioxide layer.

DESCRIPTION OF THE DRAWINGS

A field effect transistor device and a method of production of such a device that are particular preferred embodiments of the invention will now be described, by way of example, with reference to the accompanying drawings wherein.

Figure 1:
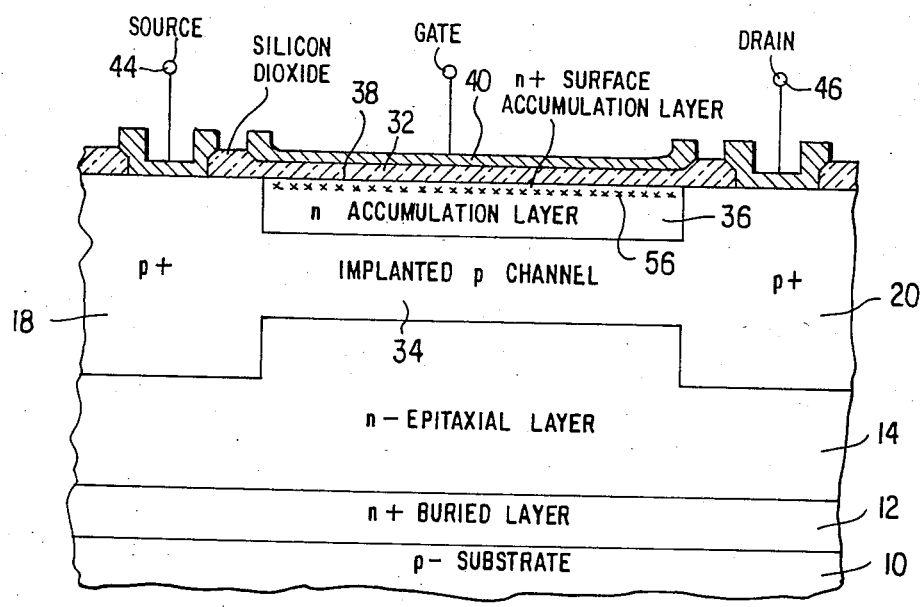
FIG. 1 is a cross section through the device taken along the channel.

As is usual in the illustration of solid state devices, particularly those that can be used in MSI, LSI etc. configurations, the thicknesses, widths, etc., of the various layers are not to any scale to assist the clarity of illustration and reference thereto.

DESCRIPTION OF THE PREFERRED EMBODIMENTS

The devices and processes of the invention to be particularly described are of MSI type in which for example the resulting device occupies an area on a silicon chip of about 50 microns square. The starting material is therefore a silicon wafer of p-type constituting a substrate 10 into the upper portion (as seen in the drawing) of which is diffused a layer 12 of a plurality of n+ type buried segments 12 that are usually employed in bipolar construction technology, for example to reduce parasitic device action. An n-type epitaxial layer 14 of [100] crystal orientation is grown over the layers 12; the material is preferably of about 1–2 ohm. cm resistivity from the usual range of about 0.1–10 ohm. cm. In the case where adjacent SJFET and bipolar devices are to be formed an isolating p-type zone 16 (FIG. 3) will be provided between the two layers 14. A p+-type diffusion is now performed on the epitaxial layer to provide source and drain zones 18 and 20 for the SJFET and also base zone 22 for the BT. An n+ type diffusion is then performed to provide two spaced zones 24 and 26 (FIG. 2) defining with the p+ type zones 18 and 20 the zone to be occupied by the channel, which extends between the p+ zones 18 and 20 and is bounded by the two n+ zones 24 and 26; at the same time the two n+ zones 28 and 30 required for the BT emitter and collector respectively can be formed.

Figure 2:
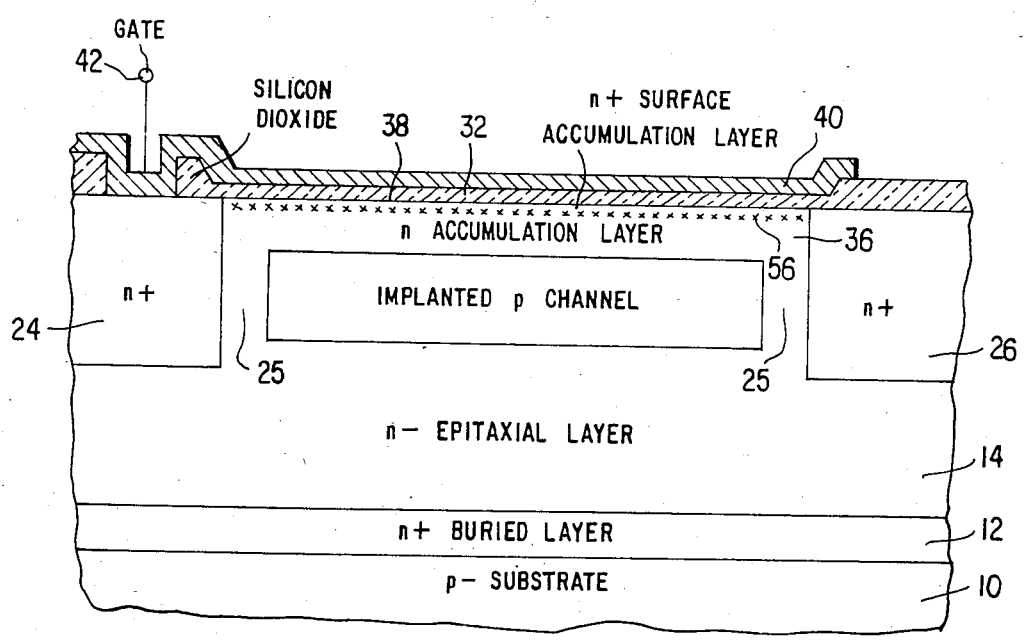
FIG. 2 is a cross section through the device of FIG. 1 taken at right angles to that of FIG. 1 across the channel.
Figure 3:
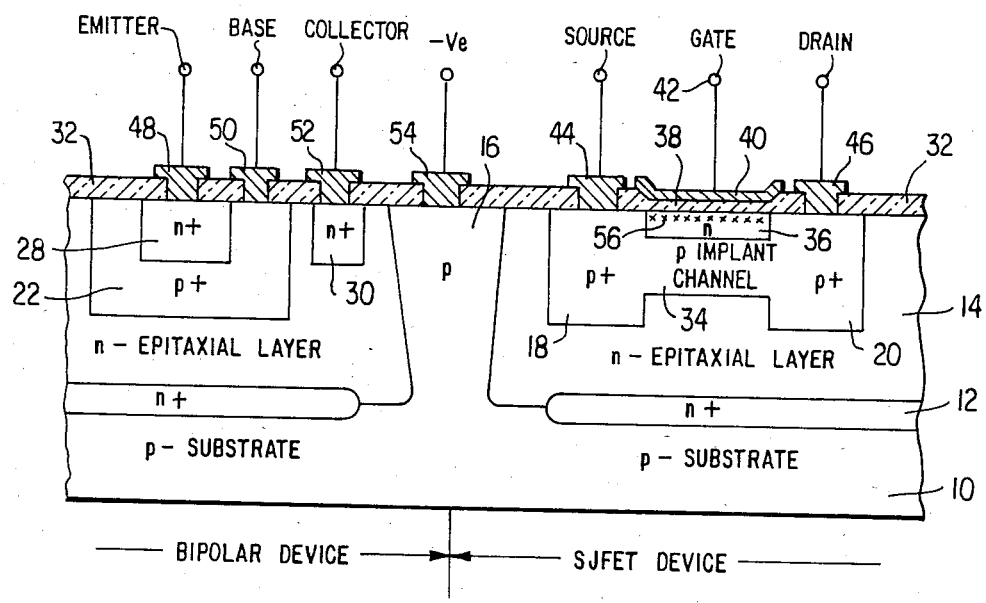
FIG. 3 is a cross section similar to FIG. 1 to illustrate the manner in which a field effect transistor device and a bipolar transistor device can be formed on the same substrate.

A passivating layer 32 of silicon dioxide is now grown over the device surface to provide the usual passivation. As a specific example only this was produced by a wet oxidation process at 875° C. to give a layer of 80 nanometers (800 Å) thickness. Other processes can of course be employed. It is found that during this step the redistribution of impurities is minimal. Channel zone or region 34 of p-type (usually boron) is now formed by high-energy ion implantation through the passivating layer, the dose and energy being so adjusted that the channel region is totally embedded in the epitaxial layer to leave a thin n-type layer 36 between the p-type channel and the silicon dioxide layer/device interface 38. As shown in FIG. 2 the n-type layer 36 is coupled to the n-type epitaxial layer through the n-type zones 25. In a specific device boron was implanted using an implant dose in the range $5 \times 10^{11}$ to $6.5 \times 10^{11}$ ions·cm$^{-2}$ at an energy of 120 Kiloelectronvolts. The resulting implant at the higher values had a peak amount of ions at 0.27 micrometers below the silicon/silicon dioxide interface 38. The structure is annealed in an inert ambient atmosphere until total carrier activation is obtained, and again as a specific example only, this can be performed at 875° C. in dry nitrogen for a period of about 30 minutes. Subsequently a thin conductive layer 40 of metal is deposited over the layer 32 so as to overlie the channel region 34, this metal layer being electrically connected to gate terminal 42 connected to the n+ type zone 24. Source terminal 44 and drain terminal 46 for the SJFET are formed in any conventional manner with the gate terminal 42; at the same time emitter, base and collector terminals, 48, 50 and 52 respectively, for the bipolar device are formed. Also at the same time a terminal 54 for the p-type zone 16 can be formed, this terminal being connected in operation to a source of negative potential to provide the necessary isolation by reverse bias between the B.T. and the SJFET.

The resulting SJFET devices can be made to be operative with pinchoff voltages in the range 0.3–0.5 volt and even in this low range the reproducibility of the device parameters is found to be excellent. For example, it has been found that matching of the order of ±20% can be obtained in transconductance, drain current and pinchoff voltage between devices on the same wafer, while for devices in close proximity on the same chip a matching of ±5% is obtainable. Moreover, it is found that the device behaviour is now substantially independent of the characteristics of the passivating oxide layer 32, and of its interfaces with the adjacent layers, particularly with the silicon layer. The device operates in a similar manner to prior art devices in which an implanted n+ type gate zone has been provided over the channel region to give this zone. The transconductance of the device is found to be bulk mobility dominated and cutoff frequencies of as high as 5 Megahertz have already been obtained. Such devices therefore find ready application in a wide variety of low voltage BIFET analog circuits including high impedance input differential stages, active loads, biasing current sources and analog switches.

This effect results from the positive fixed oxide charge in the passivating oxide layer 32, the gate voltage, and the work function difference between the metal of the layer 40 and the semiconductor layer 36, which bring about the existence of a high conductivity electron accumulation n+ type zone 56 at the surface of the n-type layer 36 adjacent to the interface 38. This electron accumulation zone or layer forms immediately once the silicon dioxide layer is applied and once formed provides a corresponding accumulated electric field that raises the surface potential in this zone above the potential of the neutral n back gate and buffers the channel from the passivating layer. This gives the above-described independence of the characteristics of layer 32 and its interfaces. However, the stability of the electron accumulating zone is improved to a practical level when the metal layer 40 is applied. The relatively thin n-type layer 36 preferably has a thickness comparable to the local extrinsic Debye length, while the underlying p-type channel is of thickness more than an order of magnitude greater than its corresponding extrinsic Debye length. Debye length may be defined as the interaction distance for two charges in a layer and is employed in the art as a parameter defining doping concentration. If the layer 36 is made too thin and also with too large a Debye length then the buffering action is lost and the effect of the passivating layer 32 returns, while if it is made too thick and also with too small a Debye length, then the electron accumulation layer cannot form and again the beneficial effect is lost.

It is found that a minimum value of oxide capacitance must be present in the silicon dioxide layer 32 if the pinchoff voltage and transconductance are to be sufficiently independent of the characteristics of the layer 32. If for example, minimum oxide capacitance is plotted as a function of oxide charge then devices with pinchoff voltages lower than 0.5 volt are immune to variations in the properties of the passivating oxide provided its fixed oxide charge density exceeds about $3.5 \times 10^{11}$ ions cm$^{-2}$, while for the devices with pinchoff voltages lower than 0.35 volt the corresponding value for immunity is about $2.7 \times 10^{11}$ ions·cm$^{-2}$.

The diffused n+ zones 24 and 26 provides a necessary electrical path between the electron accumulation layer and the epitaxial layer 14, and serve as electron sources from which the electrons for the electron accumulation layer can be obtained. The layer 56 is indicated as separate from the layer 36 but this is of course for purposes of illustration only; it will inherently form at the interface with the usual decreasing density gradient away from the interface.

It may be noted that the structure of devices of the invention differs from that of the usual depletion MOSFET or buried channel MOSFET, in that in the invention structure the buried channel is buffered from the interface 38 by the thin lightly doped layer 36 of opposite impurity type.

It is understood by persons skilled in this particular art that a positive superscript for either n or p merely indicates a somewhat higher doping concentration.

In a particular device of about 40 microns square the substrate 10 is a p-type silicon of about 10 ohm. cms resistivity while the buried layer 12 is produced by diffusing arsenic therein to a sheet resistivity of about 25 ohms. per square, such a layer usually being about 3–4 microns thick. The n-type epitaxial layer is 10 microns thick and of resistivity 1.6 ohm. cm, while the implanted channel was produced using the dose rates etc. described above to give a channel as described and of width/length ratio about 4. The p+ type source and drain zones were produced by Boron diffusion to a sheet resistivity of about 200 ohms. per square cm. while the n+ zones were produced by phosphorus diffusion to 4 ohms. per square cm. The resultant device had a drain saturation current of 6 microamps, a transconductance of about 26 micromhos and a pinch-off voltage of 0.4 volts.

We claim:

1. A subsurface junction effect transistor device having a gate, a p-type source and a p-type drain, said device comprising:
   a layer of n-type epitaxial silicon material having a surface;
   a p-type channel implanted in the said layer of n-type epitaxial silicon material below the surface thereof to provide an electron accummulating n-type layer between said p-type channel and an adjacent portion of said surface of the n-type epitaxial silicon material said electron accummulating n-type layer having a layer thickness corresponding to its local extrinsic Debye length, and said p-type channel having a channel thicknes more than an order of magnitude greater than the extrinsic Debye length of said electron accumulating layer;
   said p-type channel directly merging into said p-type source and said p-type drain;
   a silicon dioxide passivating layer overlying at least the electron-accumulating n-type layer; and
   a conductive metal layer electrically connected to the gate said conductive metal layer overlying the silicon dioxide passivating layer and said conductive metal layer constituting means for providing an electron-accumulating n-type zone in the electron-accumulating n-type layer at said adjacent protion of said surface interfacing with said silicon dioxide passivating layer, said electron accumulating n-type zone providing an electric field for raising the surface potential in the electron accumulating n-type zone above the potential of the gate for buffering said p-type channel from said silicon dioxide passivating layer.

2. A device as claimed in claim 1, wherein the electron-accumulating n-type layer is coupled to the layer of n-type epitaxial silicon material through at least one n-type zone adjoining the channel.

3. A device as claimed in claim 1 or 2, in combination with a bipolar transistor device formed on the said layer of an n-type epitaxial silicon material.

* * * * *